(12) United States Patent
Ko et al.

(10) Patent No.: US 12,228,262 B2
(45) Date of Patent: Feb. 18, 2025

(54) LIGHTING DEVICE AND VEHICLE LAMP COMPRISING SAME

(71) Applicant: LG INNOTEK CO., LTD., Seoul (KR)

(72) Inventors: Kwang Hyun Ko, Seoul (KR); Moo Ryong Park, Seoul (KR); Woo Kil Jung, Seoul (KR); So Yeon Ham, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/691,558

(22) PCT Filed: Sep. 16, 2022

(86) PCT No.: PCT/KR2022/013839
§ 371 (c)(1),
(2) Date: Mar. 13, 2024

(87) PCT Pub. No.: WO2023/043244
PCT Pub. Date: Mar. 23, 2023

(65) Prior Publication Data
US 2024/0401766 A1    Dec. 5, 2024

(30) Foreign Application Priority Data

Sep. 16, 2021    (KR) .................. 10-2021-0124388

(51) Int. Cl.
*F21S 43/241*    (2018.01)
*B60Q 1/26*    (2006.01)
(Continued)

(52) U.S. Cl.
CPC ............. *F21S 43/241* (2018.01); *F21S 43/14* (2018.01); *F21S 43/31* (2018.01); *B60Q 1/26* (2013.01)

(58) Field of Classification Search
CPC .......... F21S 43/241; F21S 43/14; F21S 43/31; B60Q 1/26
See application file for complete search history.

(56) References Cited

U.S. PATENT DOCUMENTS 10,288,800 B1    5/2019    Keranen et al.
10,327,313 B2    6/2019    Choi et al.
(Continued)

FOREIGN PATENT DOCUMENTS

JP    2018152367 A    *    9/2018
KR    10-2011-0130143        12/2011
(Continued)

OTHER PUBLICATIONS

International Search Report dated Jan. 17, 2023 issued in Application No. PCT/KR2022/013839.

*Primary Examiner* — Matthew J. Peerce
(74) *Attorney, Agent, or Firm* — KED & ASSOCIATES, LLP

(57) ABSTRACT

The lighting device disclosed at an embodiment includes a substrate; a plurality of light sources arranged on the substrate; a resin layer sealing the plurality of light sources; a reflective member disposed between the resin layer and the substrate; and an antenna pattern disposed in a first region between the reflective member and the substrate.

15 Claims, 7 Drawing Sheets

(51) Int. Cl.
*F21S 43/14* (2018.01)
*F21S 43/31* (2018.01)

(56) References Cited

U.S. PATENT DOCUMENTS

| | | |
|---|---|---|
| 10,670,800 B2* | 6/2020 | Keränen .............. G02B 6/0031 |
| 11,592,146 B2* | 2/2023 | Zou ....................... H05B 47/19 |
| 2013/0155664 A1 | 6/2013 | Kim |
| 2015/0195892 A1 | 7/2015 | Park et al. |
| 2017/0142812 A1* | 5/2017 | Creemers .............. F21V 23/045 |
| 2020/0412450 A1 | 12/2020 | Pederson |

FOREIGN PATENT DOCUMENTS

| | | |
|---|---|---|
| KR | 10-2013-0070476 | 6/2013 |
| KR | 10-2015-0082897 | 7/2015 |
| KR | 10-2018-0092550 | 8/2018 |
| KR | 10-2018-0130563 | 12/2018 |
| KR | 10-2020-0076659 | 6/2020 |
| KR | 10-2021-0073588 | 6/2021 |

* cited by examiner

[FIG. 1]
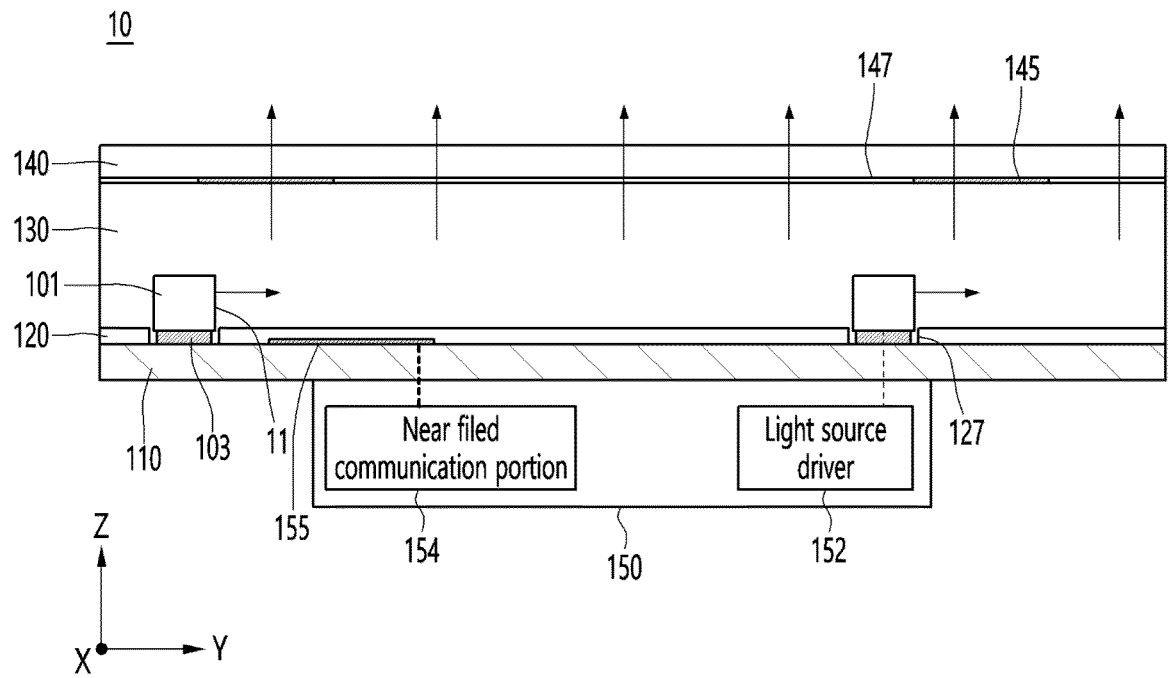
[FIG. 2]
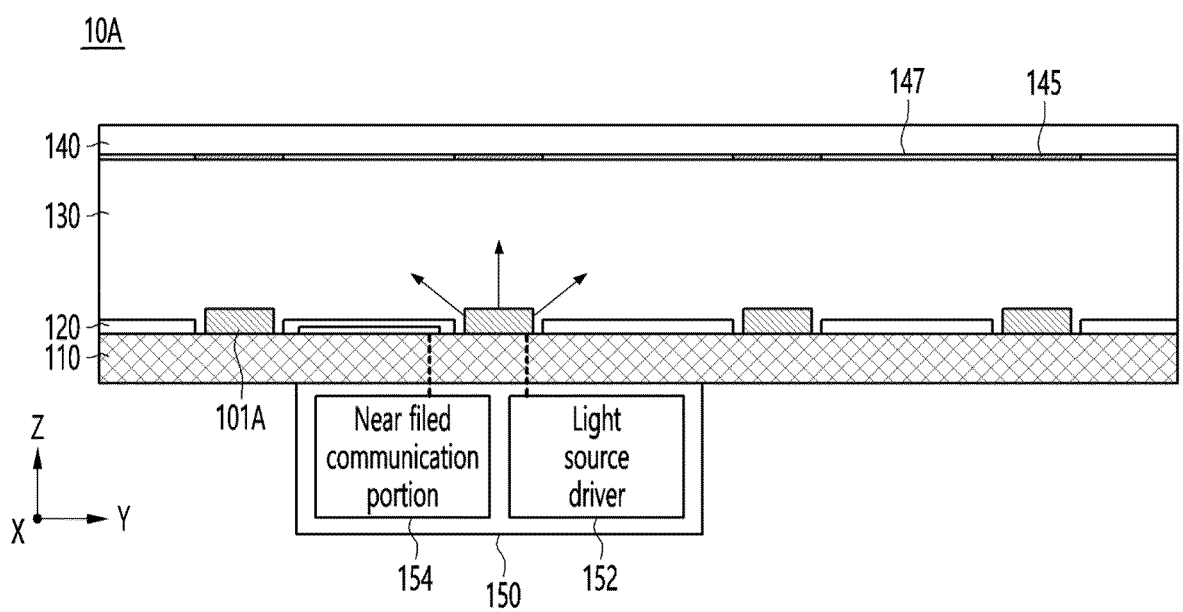

[FIG. 3]
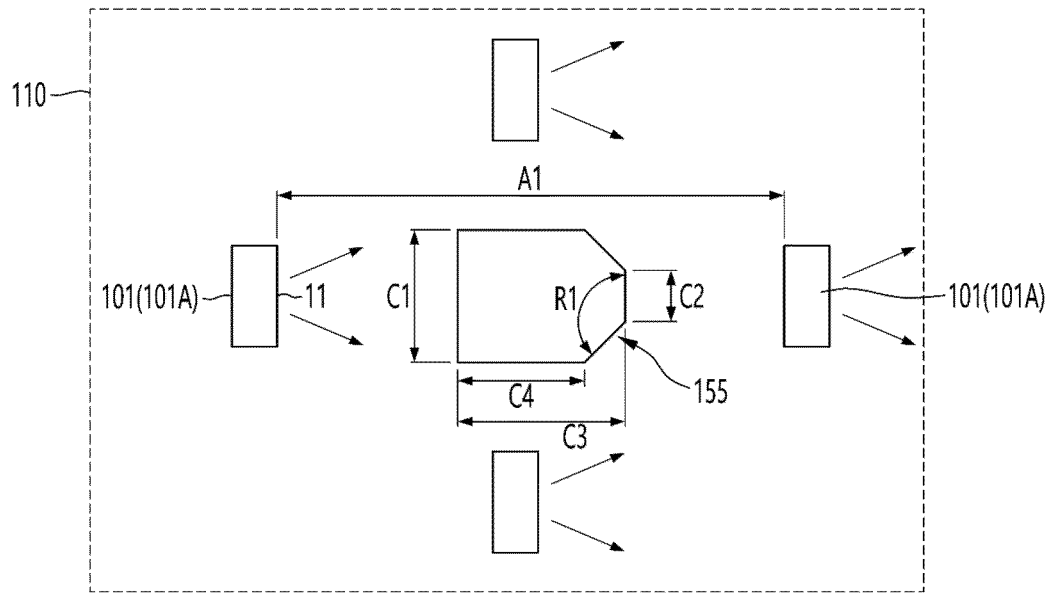
[FIG. 4]
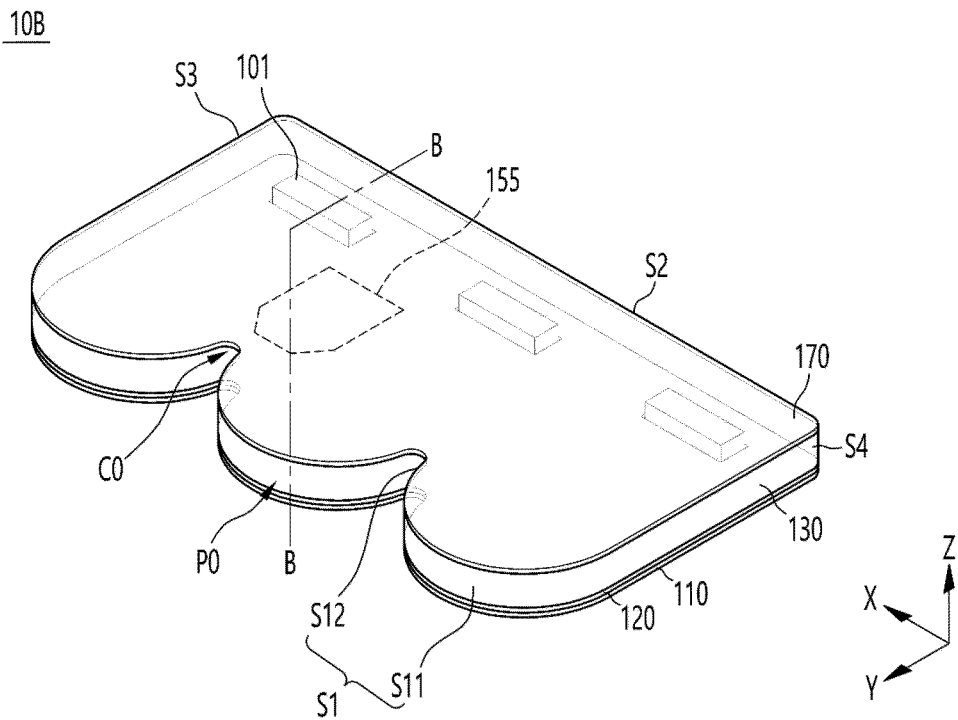

[FIG. 5]
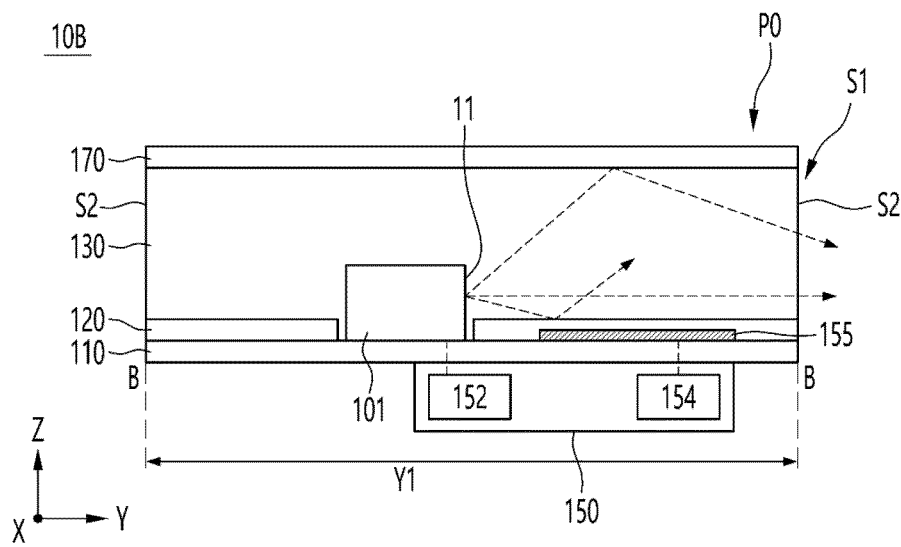
[FIG. 6]
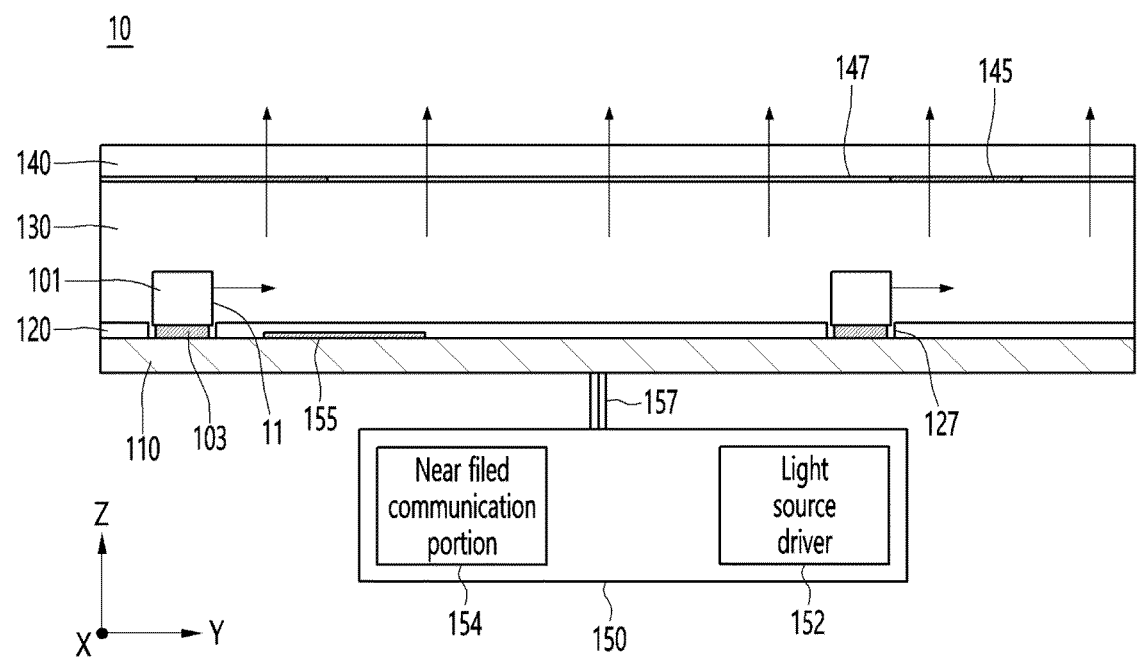

[FIG. 7]
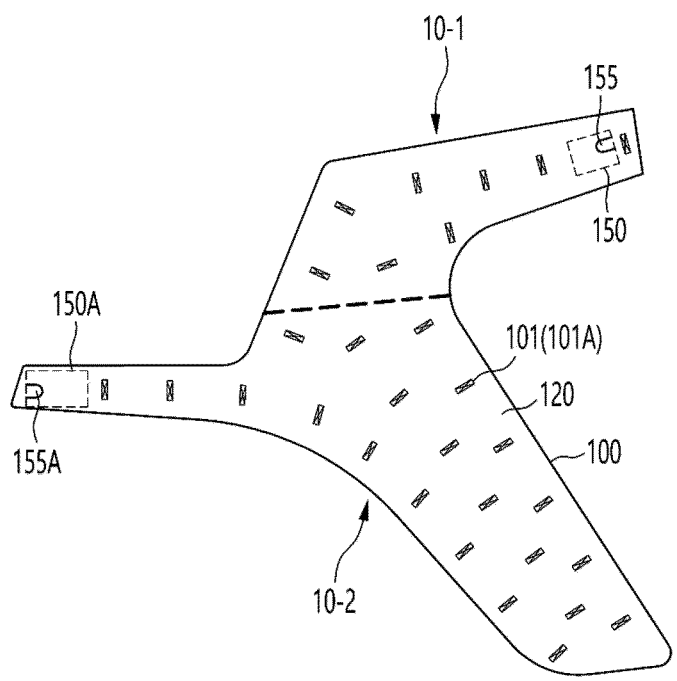

[FIG. 8]
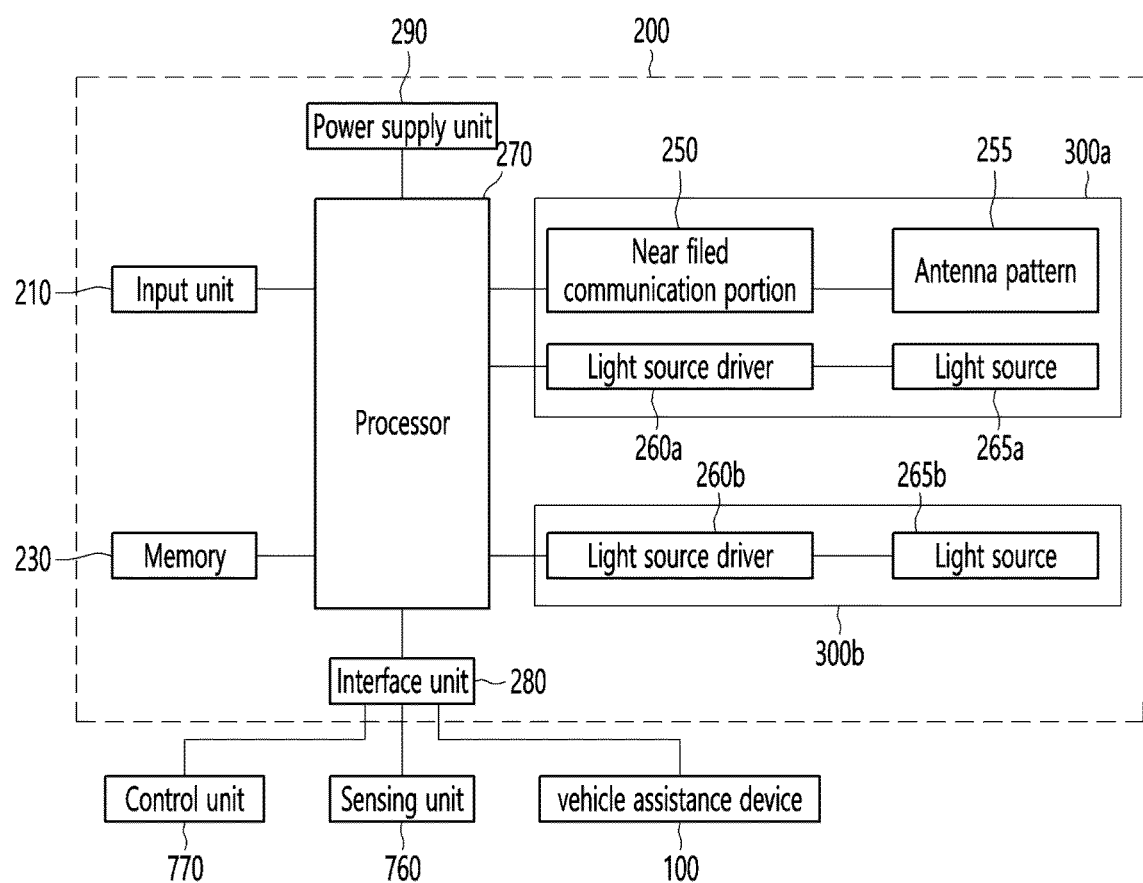

[FIG. 9]
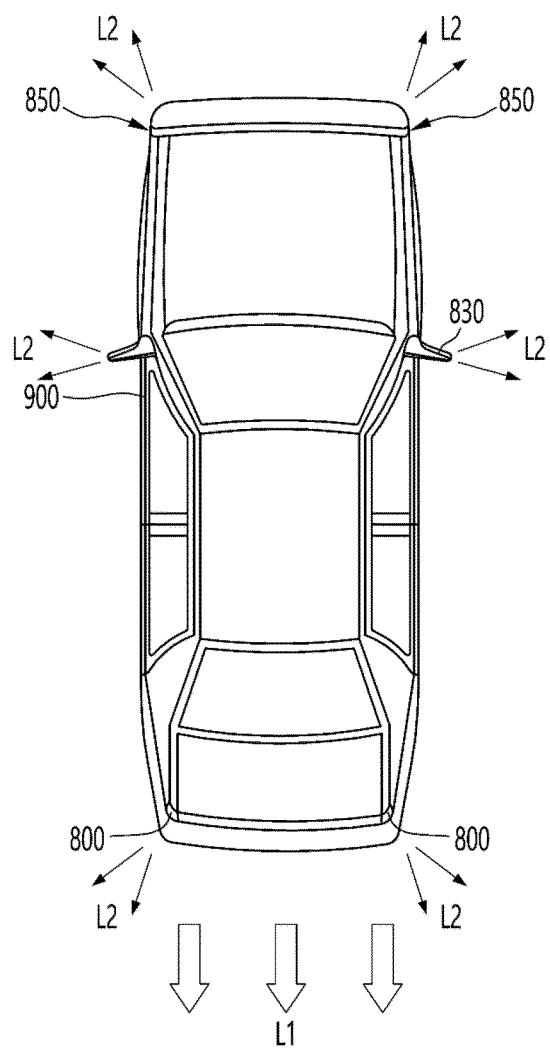

[FIG. 10]
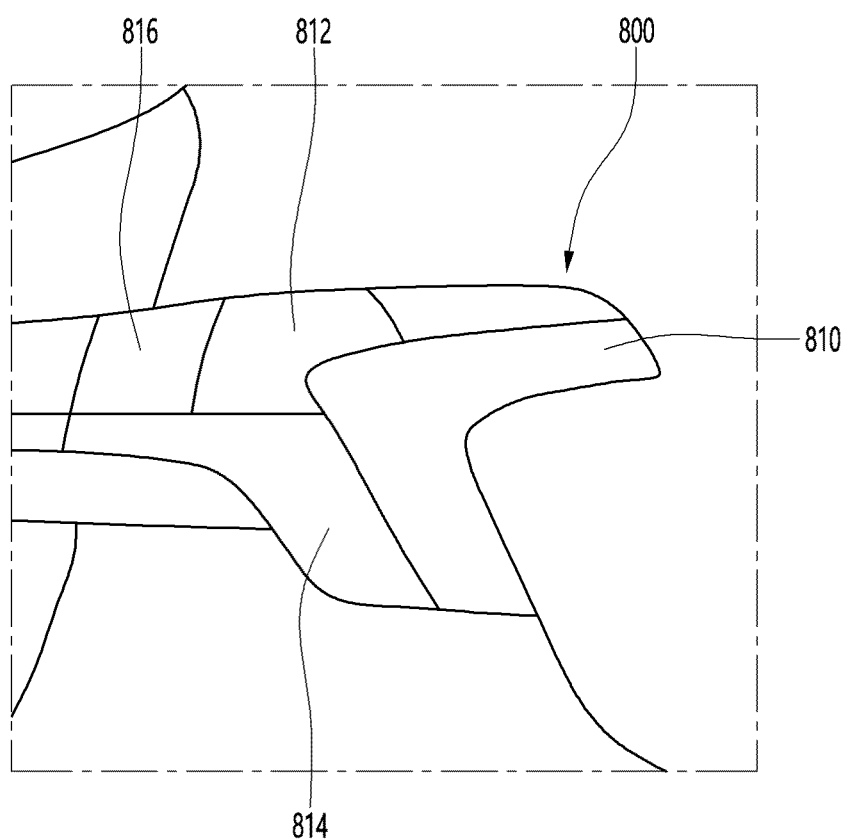

LIGHTING DEVICE AND VEHICLE LAMP COMPRISING SAME

CROSS-REFERENCE TO RELATED PATENT APPLICATIONS

This application is a U.S. National Stage Application under 35 U.S.C. § 371 of PCT Application No. PCT/KR2022/013839, filed Sep. 16, 2022, which claims priority to Korean Patent Application No. 10-2021-0124388, filed Sep. 16, 2021, whose entire disclosures are hereby incorporated by reference.

TECHNICAL FIELD

An embodiment of the invention relates to a lighting device having an antenna pattern. An embodiment of the invention relates to a lighting device having an antenna pattern and a light unit or vehicle lamp having the same.

BACKGROUND ART

Light emitting diode (LED) have advantages such as low power consumption, semi-permanent life, fast response speed, safety, and environmental friendliness compared to conventional light sources such as fluorescent lamps and incandescent lamps. These light emitting diodes are applied to various display devices, various lighting devices such as indoor or outdoor lights. Recently, as a vehicle light source, a lamp employing a light emitting diode has been proposed. Compared with incandescent lamps, light emitting diodes are advantageous in that power consumption is small. In addition, because the light emitting diode is small in size, it can increase the design freedom of the lamp and is economical due to its semi-permanent lifespan.

DISCLOSURE

Technical Problem

An embodiment of the invention may provide a lighting device that has an antenna pattern and irradiates surface light. An embodiment of the invention may provide a lighting device that has an antenna pattern and irradiates line-width light. An embodiment of the invention may provide a light unit, a display device, or a vehicle lamp having a lighting device with an antenna pattern.

Technical Solution

A lighting device according to embodiment of the invention comprises a substrate; a plurality of light sources arranged on the substrate; a resin layer sealing the plurality of light sources; a reflective member disposed between the resin layer and the substrate; and an antenna pattern disposed in a first region between the reflective member and the substrate.

According to an embodiment of the invention, the first region may be disposed in a lower region between two adjacent light sources. A maximum length of the antenna pattern may be smaller than an interval between the plurality of light sources. A driving module disposed on one side of the substrate and having a light source driver for driving the light source and a near filed communication portion connected to the antenna pattern may be included. The driving module may be adhered to a lower surface of the substrate or connected to a connector of the substrate through a signal cable.

According to an embodiment of the invention, an optical member disposed on the resin layer and a light blocking portion disposed on each of the light sources may be included, and the light blocking portion may overlap the antenna pattern in a vertical direction. A reflective layer is disposed on the resin layer, and light emitted from the plurality of light sources is extracted through one side of the resin layer, and the antenna pattern may be disposed on an emission side of any one of the plurality of light sources. According to an embodiment of the invention, a thickness of the antenna pattern is thinner than a thickness of the reflective member, and the reflective member may cover an entire surface of the antenna pattern.

A lighting device according to an embodiment of the invention comprises a substrate; a plurality of light sources arranged on the substrate; a resin layer sealing the plurality of light sources; a reflective member disposed between the resin layer and the substrate; and an antenna pattern disposed in a first region between the reflective member and the substrate, wherein the antenna pattern is formed as a partial pattern of a wiring layer disposed on the substrate, and a thickness of the antenna pattern may be a same as a thickness of the wiring layer.

According to an embodiment of the invention, the antenna pattern may be disposed on an emission side of at least one of the plurality of light sources. A maximum length of the antenna pattern is smaller than an interval between the plurality of light sources, a width of one side of the antenna pattern is smaller than a width of the other side, and the other side of the antenna pattern may be disposed adjacent to the emission side of at least one of the plurality of light sources.

According to an embodiment of the invention, a driving module disposed on one side of the substrate and having a light source driver for driving the light source and a near filed communication portion connected to the antenna pattern may be included, and the driving module may be adhered to a lower surface of the substrate or connected to a connector of the substrate through a signal cable.

According to an embodiment of the invention, an optical member on the resin layer and a plurality of light blocking portions disposed on each of the plurality of light sources is included, and at least one of the plurality of light blocking portions may overlap the antenna pattern in a vertical direction.

According to an embodiment of the invention, a reflective layer on the resin layer is included, and light emitted from the plurality of light sources may be extracted through one side of the resin layer.

A vehicle lamp according to an embodiment of the invention includes a lamp disclosed above having at least one of a tail light, a turn signal light, a reversing light, a brake light, and a daytime running light.

Advantageous Effects

According to an embodiment of the invention, lighting and communication may be performed using a lighting device. Additionally, since the antenna pattern is sealed using a resin layer or a reflective member within the lighting device, deterioration in the performance of the antenna pattern may be prevented. In addition, the antenna pattern is integrally embedded within the lighting device, installation of the communication antenna may be easy and communication may be convenient, and in general, space utilization may be improved because a space in which a communication antenna arranged as a separate device is not required separately. The lighting device according to an embodiment of the invention may use the light source driver and the near filed communication portion to share power and communication. The reliability of lighting devices according to embodiments of the invention is improved, and may be applied to light units, various display devices, or vehicle lamps having the same.

DESCRIPTION OF DRAWINGS

FIG. 1 is a side cross-sectional view showing a lighting device according to an embodiment of the invention.

FIG. 2 is a diagram showing another example of the lighting device of FIG. 1.

FIG. 3 is an example of a plan view for explaining the antenna pattern and light source arrangement arranged in FIGS. 1 and 2.

FIG. 4 is a first modified example of the lighting device of FIG. 1.

FIG. 5 is a side cross-sectional view taken along line B-B of the lighting device of FIG. 4;

FIG. 6 is an example of connecting the driving module in the lighting device of FIG. 1 with a cable.

FIG. 7 is a diagram showing an example of a light source and antenna pattern arranged on a substrate according to an embodiment of the invention.

FIG. 8 is a block diagram of a vehicle lighting device according to an embodiment of the invention.

FIG. 9 is a plan view of a vehicle to which a lamp having a lighting device according to an embodiment of the invention is applied.

FIG. 10 is a perspective view of the tail light of FIG. 9.

BEST MODE

Hereinafter, preferred embodiments of the invention will be described in detail with reference to the accompanying drawings. However, a technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

FIG. 1 is a side cross-sectional view showing a lighting device according to an embodiment of the invention, FIG. 2 is a view showing another example of the lighting device of FIG. 1, and FIG. 3 is an example of a plan view for explaining the antenna pattern and light source arrangement arranged in FIGS. 1 and 2.

Referring to FIG. 1, a lighting device 10 according to an embodiment of the invention may include a substrate 110, a light source 101 disposed on the substrate 110, and a resin layer 130 covering the light source 101 on the substrate 110, and an optical member 140 disposed on the resin layer 130. The lighting device 10 may include a reflective member 120 disposed between the substrate 110 and the resin layer 130 and an antenna pattern 155 disposed in a first region between the reflective member 120 and the substrate 110.

The lighting device 10 may emit light emitted from the light source 101 as surface light. The light sources 101 may be arranged in plurality on the substrate 110, and the light sources 101 may be arranged in one or more rows and one or more columns. The light sources 101 may be arranged in n rows and m columns (n, m=2 or more). The lighting device 10 may be applied to various lamp devices that require lighting, such as vehicle lamps, household lighting devices, and industrial lighting devices. For example, in the case of lighting modules applied to vehicle lamps, it may be applied to head lamps, side lights, side mirror lights, fog lights, tail lamps, turn signal lamps, back up lamps, stop lamps, daytime running light, vehicle interior lighting, door scarf, rear combination lamp, backup lamp, etc.

The substrate 110 may function as a base member or support member located below the light source 101 and the resin layer 130. The substrate 110 includes a printed circuit board (PCB). The substrate 110 may include, for example, at least one of a resin-based printed circuit board (PCB), a metal core PCB, a flexible PCB, a ceramic PCB, or an FR-4 board. The substrate 110 may include, for example, a flexible PCB or a rigid PCB. The upper surface of the substrate 110 has an X axis and Y axis plane, and the thickness of the substrate 110 may be the height of the Z direction orthogonal to the X and Y directions. Here, the Y direction may be a first direction, the X direction may be a second direction orthogonal to the Y direction, and the Z direction may be a third direction orthogonal to the X and Y directions.

The substrate 110 includes a wiring layer (not shown) on the upper portion, and the wiring layer may be electrically connected to the light sources 101 and the antenna pattern 155. The light sources 101 may be connected in series, parallel, or series-parallel by the wiring layer of the substrate 110. The light sources 101 may be connected in series or parallel in groups of two or more, or the groups may be connected in series or parallel. The wiring layer may include a vertically penetrating via, and the antenna pattern may be electrically connected to the driving module 150 through the wiring layer or via.

The thickness of the substrate 110 may be 0.5 mm or less, for example, in the range of 0.3 mm to 0.5 mm. Since the substrate 110 is provided with a thin thickness, the flexible module may be supported without increasing the thickness of the lighting module. The substrate 110 may have a top view shape of a rectangle, a square, or another polygonal shape, or may have a curved bar shape. The substrate 110 may include a protective layer or a reflective layer on an upper portion of the substrate 110. The protective layer or reflective layer may include a member made of a solder resist material, and the solder resist material is a white material and may reflect incident light. As another example, the substrate 110 may include a transparent material. Since the substrate 110 is made of a transparent material, light emitted from the light source 101 may be emitted in the upper and lower directions of the substrate 110.

The light source 101 may be disposed on the substrate 110 and sealed by the resin layer 130. The plurality of light sources 101 may be in contact with the resin layer 130. The resin layer 130 may be disposed on the side and upper surfaces of the light source 101. The resin layer 130 seals the light sources 101 and may be in contact with the upper surface of the substrate 110 and/or the reflective member 120.

Light emitted from the light source 101 may be emitted through the resin layer 130. The light source 101 may emit light through the emission surface 11. That is, the light source 101 may be implemented as a package with an LED chip inside, for example, as a side view type package. As shown in FIG. 2, the light source 101A may be implemented as an LED chip that emits light through multiple sides, and may be disposed on the substrate 110 in the form of a flip chip. In the lighting device 10A of FIG. 2, the light sources 101A may be arranged in the first and second directions on a substrate 110, and each light source 101A may be implemented as an LED chip. Each of the light sources 101A is sealed by a resin layer 130, and a light blocking portion 145 or a light blocking structure (e.g., cavity, or recess) may be disposed on the upper portion thereof. The light sources 101 and 101A include a light emitting diode chip and may emit at least one of blue, red, green, white, ultraviolet (UV), or infrared light. The light sources 101 and 101A emit, for example, at least one of blue, red and green light, and blue, red, green or white light may be emitted through the surface of the lighting devices 10 and 10A.

As shown in FIGS. 1 and 2, the resin layer 130 is disposed on the substrate 110 and seals the light sources 101 and 101A. The resin layer 130 may be made of a transparent resin material, such as UV (Ultra violet) resin, silicone, epoxy, or PET (polyethylene terephthalate). The resin layer 130 may be a transparent material layer to which no impurities are added. Since the resin layer 130 is free of impurities, light may pass through the resin layer 130 with straightness. As another example, the resin layer 130 may include a diffusion agent therein. The resin layer 130 may have a refractive index of 1.70 or less, for example, in the range of 1.25 to 1.70. If the refractive index of the resin layer 130 is outside the above range, light extraction efficiency may be reduced. Each of the light sources 101 and 101A has a bonding portion disposed at the bottom and may be electrically connected to a pad of the substrate 110. The light emitting chip may emit at least one of blue, red, green, and ultraviolet (UV) light. The light source 101 may emit at least one of white, blue, red, and green. The light sources 101 and 101A may include phosphors.

The resin layer 130 may be thicker than the thickness of the light sources 101 and 101A. The thickness of the resin layer 130 may be thicker than the thickness of the substrate 110. The thickness of the resin layer 130 may be at least 5 times thicker than the thickness of the substrate 110, for example, in the range of 5 to 9 times. By being disposed with the above thickness, the resin layer 130 may seal the light sources 101 and 101A on the substrate 110, prevent moisture from penetrating, and support the substrate 110. The resin layer 130 and the substrate 110 may function as flexible plate. The thickness of the resin layer 130 may be 2.7 mm or less, for example, in the range of 1.8 mm to 2.7 mm. If the thickness of the resin layer 130 is less than the above range, the interval between the light source 101 and 101A and the optical member 140 may be reduced or the thickness of the layer for diffusion may be thick, and if it is greater than the above range, a module thickness may increase or luminosity may decrease. The resin layer 130 is disposed between the substrate 110 and the optical member 140 to guide the light emitted from the light sources 101 and 101A and emit surface light in an upward direction. The optical member 140 may emit light from the resin layer 130 as uniformly distributed surface light.

As shown in FIGS. 1 and 2, the optical member 140 may be attached to the upper surface of the resin layer 130 or may be spaced apart from the surface of the resin layer 130. The optical member 140 may be a resin layer containing at least one or two types of diffusion agent, phosphor, and ink particles. The optical member 140 may be arranged as a single layer or may be stacked as a plurality of layers. The content of the diffusion agent added to the optical member 140 may range from 2 wt % to 5 wt % in the resin material. If the content of the diffusion agent is less than the above range, there is a limit to lowering the hot spot, and if it is greater than the above range, light transmittance may be reduced. Therefore, the diffusion agent may diffuse light and reduce hot spots without reducing light transmittance. The diffusion agent may include at least one of PMMA (Polymethyl Methacrylate) series, $TiO_2$, $SiO_2$, $Al_2O_3$, and silicon series.

In the case of having a phosphor inside the optical member 140, the content of the phosphor is added in the same amount as the resin material forming the optical member 140, or the phosphor may be added in a ratio of 40% to 60% compared to 40% to 60% of the resin material of the optical member 140. The phosphor may include at least one of a red phosphor and a yellow phosphor. When the optical member 140 has ink particles therein, the ink particles may include at least one of metal ink, UV ink, or curing ink. The types of ink particles may be selectively applied among PVC (poly vinyl chloride) ink, PC (polycarbonate) ink, ABS (acrylonitrile butadiene styrene copolymer) ink, UV resin ink, epoxy ink, silicone ink, PP (polypropylene) ink, water-based ink, plastic ink, PMMA (poly methyl methacrylate) ink, or PS (polystyrene) ink. Here, the width or diameter of the ink particles may be 5 (or less or in the range of 0.05 μm to 1 μm. At least one of the ink particles may be smaller than the wavelength of light. The ink particles may include at least one of metallic ink, UV ink, or curing ink. The size of the ink particles may be smaller than the size of the phosphor. At least one of the ink particles may be smaller than the wavelength of light. The surface color of the ink particles may be any one of green, red, yellow, and blue.

The optical member 140 may contain phosphor and ink particles without a diffusion agent. In this case, the phosphor emits a red wavelength, and the ink particles may contain red. For example, the red color of the ink particles may be darker than the color of the phosphor or the wavelength of light. The ink particles may have a color different from the color of the light emitted from the light sources 101 and 101A. The ink particles may have the effect of blocking or blocking incident light. The optical member 140 may have the phosphor content added in a range of 23 wt % or less or 10 wt % to 23 wt %, and the ink particles may be added in a range of 12 wt % or less, for example, 4 wt % to 12 wt %. The phosphor content in the optical member 140 may be 3 wt % or more than the content of the ink particles, or may be added as high as 3 wt % to 13 wt %. Since the weight of the ink particles is smaller than that of the phosphor, the ink particles may be distributed in a region closer to the surface of the resin layer than the phosphor. Accordingly, the color of the surface of the optical member 140 may be provided as the color of ink particles. Transmission of light may be suppressed by these ink particles, and hot spots may be reduced.

The optical member 140 may be adhered to the surface of the resin layer 130 using an adhesive 147. The adhesive 147 is a transparent material and may be an adhesive such as UV adhesive, silicone, or epoxy. The optical member 140 may include at least one of a resin material, such as silicone, epoxy, or polyester (PET).

As shown in FIG. 1, a light blocking portion 145 may be disposed on a lower portion of the optical member 140. The light blocking portion 145 may be printed or attached to the lower surface of the optical member 140 and may be formed as a single layer or multiple layers. The light blocking portion 145 may overlap each of the light sources 101 in a vertical direction and may extend further toward the emission side than the emission surface 11 of each light source 101. The adhesive 147 is disposed around the light blocking portion 145 and may be adhered between the resin layer 130 and the optical member 140. Here, the light blocking portion 145 may prevent hot spots by blocking light with high intensity among the light emitted through the light source 101 on the resin layer 130. The light blocking portion 145 of FIG. 2 may be provided in a size that covers the upper portion and surrounding region of the light source 101A.

The light blocking portion 145 may be made of two or more white material layers or three or more white material layers. The light blocking portion 145 may be implemented as an overlapping structure of a diffusion pattern formed using a light blocking ink containing one or more materials selected from $TiO_2$, $CaCO_3$, $BaSO_4$, $Al_2O_3$, and silicon, and a shading pattern formed using a light blocking ink containing Al or a mixture of Al and $TiO_2$. The light blocking portion 135 may be arranged in a stacked structure of a first diffusion pattern, a light blocking pattern, and a second diffusion pattern.

As another example, the lighting devices 10 and 10A may include light sources 101 and 101A and a plurality of resin layers on the substrate 110. The plurality of resin layers may include, for example, two or more layers or three or more layers. The plurality of resin layers may optionally include at least two or three layers among a layer without impurities, a layer to which a phosphor is added, a layer with a diffusion agent, and a layer to which a phosphor/diffuser is added. At least one of the plurality of resin layers may optionally include at least one of a diffusion agent, a phosphor, and ink particles. That is, the phosphor and the diffuser may be added to separate resin layers, or may be mixed with each other and disposed in one resin layer. The impurities may include phosphors, diffusion agents, or ink particles. The layers provided with the phosphor and the diffusion agent may be arranged adjacent to each other or spaced apart from each other. When the phosphor and the layer on which the diffusion agent is disposed are separated from each other, the layer on which the phosphor is disposed may be disposed above the layer on which the diffusion agent is disposed. The phosphor and ink particles may be placed on the same layer or may be placed on different layers. The resin layer to which the ink particles are added may be disposed higher than the resin layer to which the phosphor is added.

As shown in FIGS. 1 to 3, the lighting device 10 or 10A according to an embodiment of the invention may include an antenna pattern 155. The antenna pattern 155 may be disposed in a first region of the upper surface of the substrate 110, for example, between the upper surface of the substrate 110 and the reflective member 120. The first region may be disposed on one side of one of the plurality of light sources 101 and 101A or on one side of different light sources 101 and 101A. The first region may be disposed under a region between two adjacent light sources 101 and 101A.

The antenna pattern 155 may be covered by the reflective member 120. The entire surface of the antenna pattern 155 may be disposed as the reflective member 120, and may be formed of a metal material containing at least one of Cu, Au, Ag, and Ni. The antenna pattern 155 may include the same material as the wiring layer of the substrate 110, and for example, a partial region of the wiring layer may be formed into a pattern. The thickness of the antenna pattern 155 may be thinner than the thickness of the reflective member 120. The thickness of the reflective member 120 in the first region where the antenna pattern 155 is disposed may be thinner than the thickness of the reflective member 120 in the first region without the antenna pattern. To this end, the reflective member 120 has a concave recess in the first region, and the antenna pattern 155 may be disposed in the recess.

As shown in FIGS. 1 and 2, since the antenna pattern 155 is disposed under the reflective member 120, it may not interfere with the path of light emitted through the light sources 101 and 101A. Additionally, since the antenna pattern 155 is disposed under the reflective member 120, it may provide a waterproof and dustproof effect. Since the antenna pattern 155 is disposed between the reflective member 120 and the substrate 110 and is provided within the thin lighting device 10, 10A, the deterioration in the transmission efficiency or reception efficiency of signals for wireless communication may be reduced. That is, since there are no radio interference elements on the lighting devices 10 and 10A, wireless communication may be effectively performed through the antenna pattern 155.

As shown in FIG. 3, the antenna pattern 155 may be disposed in a region between adjacent light sources 101 and 101A and may be shaped into a polygon. The other side width C2 of the antenna pattern 155 may be smaller than the one side width C1, and a length of the side C4 may be smaller than a maximum length C3 due to the inclined surface on the edge side of the other side. The one side width C1 may be smaller than the maximum length C3, and may be 3 mm or more, for example, in the range of 3 mm to 4 mm, and the maximum length C3 may be 4 mm or more, for example, in the range of 4 mm to 5 mm. The other side width C2 may be 2 mm or less, and the angle R1 of the inclined surface may be 100 degrees or more, for example, in the range of 100 to 150 degrees. This antenna pattern 155 has the width C1 on one side and the maximum length C3 that is smaller than the interval between the light sources 101 and 101A and is sealed by the reflective member 120, so that interference in the optical path may be removed, and the deterioration in transmission efficiency or reception efficiency of a wireless signal may be prevented.

A driving module 150 may be disposed outside the lighting devices 10 and 10A. The driving module 150 may include a light source driver 152 and a near filed communication portion 154, and the light source driver 152 is electrically connected to the light sources 101 and 101A and may control driving of the light source 101 and 101A. The near filed communication portion 154 may perform near field wireless communication through the antenna pattern 155. A heat sink (not shown) may be disposed on one side of the driving module 150 and/or under the substrate 110. Here, the light source driver 152 and the near filed communication portion 154 may use a common driving power source. Since this drive module 150 is installed directly or indirectly at the location where the lighting devices 10 and 10A are disposed, the installation position is free and may be freely installed at the rear of the lighting devices 10 and 10A regardless of the type of vehicle.

The near filed communication portion 154 may form a wireless area network through the antenna pattern 155 and perform near filed communication between a moving object such as a vehicle and at least one external device. The near filed communication portion 154 is for near filed communication, and may support near field communication using at least one of Bluetooth, Radio Frequency Identification (RFID), Infrared Data Association (IrDA), Ultra-Wideband (UWB), ZigBee, and NFC (Near Field Communication), Wi-Fi (Wireless-Fidelity), Wi-Fi Direct, and Wireless USB (Wireless Universal Serial Bus) technologies.

Additionally, the near filed communication portion 154 may exchange data wirelessly with a mobile terminal. The near filed communication portion 154 may receive weather information and road traffic situation information (e.g., Transport Protocol Expert Group (TPEG)) from the mobile terminal. For example, when a user boards a vehicle, the user's mobile terminal and the vehicle may pair with each other automatically or by executing the user's application. The near filed communication portion 154 or the lighting device 10 and 10A may be integrated with a lamp provided in the vehicle, and for example, may be provided in at least one of headlight, tail light, brake light, turn signal light, and sidelight. For example, the near filed communication portion 154 may exchange data with other vehicles through optical communication.

In the embodiment of the invention, a module in which the light sources 101 and 101A are arranged and a driving module 150 for driving the light sources 101 and 101A and communication are integrated, thereby achieving the effect of increasing the spatial degree of freedom of the device. The driving module 150 may be directly bonded to the lower surface of the substrate 110 at the lower surface of the substrate 110, as shown in FIGS. 1 and 2, or may be electrically connected to the circuit pattern of the substrate. As shown in FIG. 6, the driving module 150 may be spaced apart from the lower surface or outside of the substrate 110, and may be connected to a connector (not shown) of the substrate 110 through a cable 157. The cable is a signal cable and may include a wire harness.

In describing FIGS. 4 and 5, the same configuration as the configuration disclosed above will be referred to above.

Referring to FIGS. 4 and 5, the lighting device 10B may include a substrate 110, a plurality of light sources 101 disposed on the substrate 110, a resin layer 130 disposed on the substrate 110 and the light source 101, and a reflective layer 170 disposed on the resin layer 130. The lighting device 10B may include a reflective member 120 and an antenna pattern 155 disposed between the substrate 110 and the resin layer 130. The plurality of the light sources 101 may be arranged in the second direction X or in a direction from the third surface S3 to the fourth surface S4. The light sources 101 may be arranged in one row. As another example, the light sources 101 may be arranged in two or more rows arranged in different columns. The plurality of light sources 101 may be arranged on a straight line or curve extending in the second direction X.

The maximum length of the lighting device 10B in the second direction X may be greater than the maximum length Y1 in the first direction Y. The length in the first and second directions Y and X may be greater than the thickness or height in the vertical direction Z. The maximum length Y1 in the first direction Y may be 13 mm or more, for example, in the range of 13 mm to 25 mm.

The light source 101 may be disposed within the resin layer 130 between the reflective member 120 and the reflective layer 170 made of a reflective material that face each other in a vertical direction. The reflective layer 170 may be a member of a reflective material disposed on the resin layer 130, and the reflective member 120 may be a member of a reflective material disposed under the resin layer 130. The light source 101 may be disposed closer to the reflective member 120 than to the reflective layer 170. Each side surface of the lighting device 10B may have the same thickness or the same height. The light sources 101 may be sealed by a layer of transparent resin, and the layer of resin may be disposed between layers of reflective material or between a supporting member and a reflecting layer or member.

The substrate 110 includes a printed circuit board (PCB), and the resin layer 130 is disposed on the substrate 110, and may be selected from the materials of the substrate and resin layer disclosed above.

The resin layer 130 may include a first surface S1 and a second surface S2 disposed on opposite sides of each other, and a third surface S3 and fourth surface S4 disposed on opposite sides of each other. Each outer surface of the lighting device 10B may be a side surface of the resin layer 130 having the thickest thickness within the lighting device 10B. The outer side surfaces S1, S2, S3, and S4 of the resin layer 130 may be arranged in a vertical direction or on the same plane as each side surface of the substrate 110, the reflective member 120, and the reflective layer 170. The first and second surfaces S1 and S2 may extend in the second direction X from both ends of the third and fourth surfaces S3 and S4. The first surface S1 faces the second surface S1 and may include a curved surface. The first surface S1 may be a surface in the direction in which light is emitted from the plurality of light sources 101, and the second surface S2 may be a surface in a direction opposite to the direction in which light is emitted from the plurality of light sources 101. The emission surface 11 of each of the plurality of light sources 101 may face the first surface S1. Light emitted from the light sources 101 is emitted through the first surface S1, and some light may be emitted through at least one of the second surface S2, third surface S3, and fourth surface S4. That is, most of the light emitted from the light source 101 may be emitted through the first surface S1. Accordingly, a line-shaped light source may be emitted through the first surface S1 of the resin layer 130. The thickness of the first surface S1 of the resin layer 130 may be a thickness of the resin layer 130 and may be less than 3 mm.

The first surface S1 of the resin layer 130 may be an exit surface through which light emitted from the light source 101 is emitted. The first surface S1 may be a front surface or an exit surface, and the second surface S2 may be a rear surface or a non-exit surface. The first surface S1 has a flat surface in a vertical direction and may extend in a structure having a convex portion P0 and a recessed portion C0 along the second direction X. The first surface S1 may include a plurality of convex surfaces S11 corresponding to each light source 101 and a plurality of concave surfaces S12 respectively disposed between the plurality of convex surfaces S11.

The reflective member 120 may be disposed between the resin layer 130 and the substrate 110, and the resin layer 130 may be disposed between the reflective member 120 and the reflective layer 170. The reflective member 120 and the reflective layer 170 may have the same area and face each other on opposite sides of the resin layer 130. Accordingly, the resin layer 130 diffuses the light emitted from the light source 101 and the light reflected by the reflective member 120 and the reflective layer 170, and guides and emits the light in the direction of the first surface S1.

The reflective member 120 or the reflective layer 170 may be formed as a single-layer or multi-layer structure. The reflective member 120 may include a material that reflects light, such as a metal or non-metallic material. The reflective member 120 or the reflective layer 170 may include at least one of a low-reflective film, a high-reflective film, a diffusely reflective film, or a regular reflective film. For example, the reflective member 120 may be provided as a regular reflection film to reflect incident light onto the first surface S1. The reflective layer 170 may be made of the same material as the reflective member 120. The reflective layer 170 may be made of a material with a higher light reflectance or may have a greater thickness than the material of the reflective member 120 in order to reflect light and reduce light transmission loss.

The antenna pattern 155 may be disposed between the light source 101 and the convex portion P0 or between the light source 101 and the concave portion C0. The antenna pattern 155 may be disposed on the emission side of the light source 101 or between adjacent light sources 101.

One or more antenna patterns 155 may be disposed on the substrate 110 of FIGS. 1, 2, and 4. Additionally, the lighting devices 10, 10A, and 10B having the antenna pattern 155 may be placed one or more in a vehicle, and may be placed on the same lamp or different lamps.

As shown in FIG. 7, light sources 101 and 101A may be arranged on substrates 10-1 and 10-2 separated from each other. The substrates 10-1 and 10-2 may be physically separated, or may be spatially or electrically separated regions. Antenna patterns 155 and 155A may be disposed on each of the substrates 10-1 and 10-2, and driving modules 150 and 150A may be disposed below them.

One of the antenna patterns 155 and 155A may be disposed between adjacent light sources 101, and the other may be disposed further outside the outermost light source. The lamp having these substrates 10-1 and 10-2 may further have an outer lens on the outside, and may be implemented inside the lamp units 812 and 814 of FIG. 10. As another example, in the driving modules 150 and 150A, the near filed communication portion and the light source driver may be separated from each other.

FIG. 8 is a block diagram of a vehicle lamp having a lighting device according to an embodiment of the present invention.

The vehicle lamp 200 according to an embodiment of the invention may include an input unit 210, a memory 230, a first lighting device 300a, a second lighting device 300b, a processor 270, an interface unit 280, and a power supply unit 290. The input unit 210 may be provided with an input means capable of receiving a user input for controlling the operation of the vehicle lamp 210. The input unit 210 may be provided inside the vehicle 700. The input unit 210 may include a touch input means or a mechanical input means. The input unit 210 may receive a user input for turning on or off the power of the vehicle lamp 200. The input unit 210 may receive user input that may control various operations of the vehicle lamp 200. The input unit 210 may receive a user input that may control the first lighting device 300a and the second lighting device 300b. The memory 230 may store basic data for each unit of the vehicle lamp 200, control data for controlling the operation of each unit, and data input and output to the vehicle lamp 200. In terms of hardware, the memory 230 may be various storage devices such as ROM, RAM, EPROM, flash drive, hard drive, etc. The memory 230 may store various data for the overall operation of the vehicle lamp 200, such as a program for processing or controlling the processor 270.

The first lighting device 300a may include a near filed communication portion 250, an antenna pattern 255, a light source driver 260, and a light source 265. The light source driver 260 may control the light source 265a according to a control signal from the processor 170. Specifically, the light source driver 260a applies a driving current to the light source 265a according to the control signal. Light emitted from the light source 265a may be controlled according to the driving current applied from the light source driver 260a. Here, the light source 265a may be a light emitting diode, and the light source driver 260a may be an LED driver. The antenna pattern 255 may be the antenna pattern for near field communication disclosed above. The first lighting device 300a may further include a near filed communication portion 250 that drives the antenna pattern 255, or may be arranged to be spaced apart from the near filed communication portion 250. The processor 270 may control the near filed communication portion 250 that controls the antenna pattern 255.

Meanwhile, the first lighting device 300a may be implemented as a lamp at each corner of the vehicle or at least one of a mirror lamp, low beam, or high beam light emitting module for communication and lighting functions. The first lighting device 300a may be disposed in plural numbers in the vehicle. The second lighting device 300b may include a light source driver 260b, a light source 265b, a reflector (not shown), and a lens (not shown), and may be implemented as a light emitting module without a communication function, that is, without an antenna pattern. A plurality of second lighting devices 300b may be arranged within the vehicle.

The light source driver 260b may control the light source 265b according to a control signal from the processor 170. Specifically, the light source driver 260b applies a driving current to the light source 265b according to the control signal. Light emitted from the light source 265b may be controlled according to the driving current applied from the light source driver 260b. The light source 265b may generate light. The light source 265b may convert electrical energy into light energy. Meanwhile, depending on the embodiment, the second lighting device 300b may include a lens (not shown).

Meanwhile, the vehicle lamp 200 may further include a cover lens (not shown). The cover lens covers the open portion of the housing (not shown) that forms the exterior of the vehicle lamp. The cover lens (not shown) is made of transparent plastic or glass. In general, it is preferable that it is made of ALDC plastic material with excellent thermal conductivity.

The processor 270 may control the overall operation of each unit within the vehicle lamp 200. The processor 270 may output a control signal to the near filed communication portion 250 to perform communication through the antenna pattern 255. The processor 270 may be controlled by the main control unit 770 of the vehicle 700. In terms of hardware, the processor 270 may be implemented using at least one of application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, and other electrical units for performing functions.

The interface unit 280 may receive vehicle-related data or user input, or transmit signals processed or generated by the processor 270 to the outside. To this end, the interface unit 280 may perform data communication with the control unit 770, the sensing unit 760, the vehicle assistance device 100, etc. inside the vehicle through wired or wireless communication.

Meanwhile, the interface unit 280 may receive sensor information from the control unit 770 or the sensing unit 760. Here, sensor information may include at least one of vehicle direction information, vehicle location information (GPS information), vehicle angle information, vehicle speed information, vehicle acceleration information, vehicle tilt information, vehicle forward/backward information, battery information, fuel information, tire information, vehicle lamp information, vehicle interior temperature information, and vehicle interior humidity information. This sensor information may be obtained from heading sensor, yaw sensor, gyro sensor, position module, vehicle forward/reverse sensor, wheel sensor, vehicle speed sensor, vehicle body tilt sensor, battery sensor, fuel sensor, tire sensor, steering sensor by steering wheel rotation, vehicle interior temperature sensor, vehicle interior humidity sensor, and the like. Meanwhile, the position module may include a GPS module for receiving GPS information.

Meanwhile, among sensor information, vehicle direction information, vehicle location information, vehicle angle information, vehicle speed information, vehicle tilt information, etc. related to vehicle driving may be referred to as vehicle driving information.

Meanwhile, the interface unit 280 may receive object information detected in the vehicle assistance device 100 from the control unit 770 or the vehicle assistance device 100. The vehicle assistance device 100 may perform lane detection (LD), surrounding vehicle detection (VD), pedestrian detection (PD), and bright spot detection (BD), Traffic Sign Recognition (TSR), and road surface detection based on the acquired front image of the vehicle 700. The interface unit 280 may receive detected object information from the vehicle assistance device 100. Alternatively, the interface unit 280 may receive detected object information through the control unit 770.

For example, when the vehicle assistance device 100 detects an opposite vehicle in front of the vehicle, the interface unit 280 may receive the opposite vehicle detection information. Here, the opposite vehicle detection information may include the position information of the opposite vehicle, the relative distance between the opposite vehicle and the vehicle 700, and relative speed information. The power supply unit 290 may supply power required for the operation of each unit of the vehicle lamp 200 under the control of the processor 270. In particular, the power supply unit 290 may receive power from a battery inside the vehicle 700, etc.

FIG. 9 is a plan view of a vehicle equipped with a vehicle lamp to which a lighting device according to an embodiment is applied, and FIG. 10 is a diagram showing the tail light of FIG. 9.

Referring to FIGS. 9 and 10, in the moving object or vehicle 900, the front lamp 850 may include one or more lighting devices, and the operating timing of these lighting devices is individually controlled to function as a typical headlamp as well as, when the driver opens the vehicle door, additional functions such as welcome lights or celebration effects may be provided. The lamp may be applied to daytime running lights, high beams, low beams, fog lights, or turn signal lights. The lighting device of the front lamp 850 may perform lighting L1 and/or near field wireless communication L2 as described above.

In the vehicle 900, the taillights 800 may be arranged as a plurality of lamp units 810, 812, 814, and 816 supported by a housing. For example, the lamp units 810, 812, 814, and 816 may include a first lamp unit 810 disposed on the outside, a second lamp unit 814 disposed around the inside of the first lamp unit 810, and third and fourth lamp units 814 and 816 respectively disposed inside the second lamp unit 814. The first to fourth lamp units 810, 812, 814, and 816 may selectively apply the lighting device disclosed in the embodiment, and a red lens cover or a white lens cover may be disposed on the outside of the lighting device for the lighting characteristics of the lamp units 810, 812, 814, and 816. The lighting device disclosed in the embodiment applied to the lamp units 810, 812, 814, and 816 may emit surface light in a uniform distribution. The lighting device of the tail light 800 may perform lighting L1 and/or near filed wireless communication L2 as described above.

The first and second lamp units 810 and 812 may be provided in at least one of a curved shape, a straight shape, an angled shape, an inclined shape, or a flat shape, or a mixed structure thereof. The first and second lamp units 810 and 812 may be arranged one or more in each taillight. The first lamp unit 810 may be provided as a tail light, the second lamp unit 812 may be provided as a brake light, and the third lamp unit 814 may be provided as a reverse light. The fourth lamp unit 816 may be provided as a turn signal lamp. Here, the lighting devices disclosed in the embodiment may be installed in at least one of the lamp units of the vehicle, front corner, front center, rear corner, rear center, and side mirror 830 of the vehicle, or different regions, respectively, to communicate L2 with an external device with the lighting L1.

Features, structures, effects, etc. described in the above embodiments are included in at least one embodiment of the invention, and are not necessarily limited to only one embodiment. Furthermore, features, structures, effects, etc. illustrated in each embodiment may be combined or modified for other embodiments by those of ordinary skill in the art to which the embodiments belong. Accordingly, the contents related to such combinations and modifications should be interpreted as being included in the scope of the invention. In addition, although the embodiments have been mainly described above, this is only an example and does not limit the present invention, and one of ordinary skill in the field to which the present invention belongs will appreciate that various modifications and applications not illustrated above may be possible without departing from the essential characteristics of the present embodiment. For example, each component specifically shown in the embodiment may be implemented by modification. And differences related to such modifications and applications should be construed as being included in the scope of the invention defined in the appended claims.

The invention claimed is:

1. A lighting device comprising:
   a substrate;
   a plurality of light sources arranged on the substrate;
   a resin layer sealing the plurality of light sources and emitting surface light through an upper surface or side surface;
   a reflective member disposed between the resin layer and the substrate; and
   an antenna pattern disposed in a first region between the reflective member and the substrate,
   wherein the reflective member has a concave recess where the antenna pattern is disposed and
   wherein a maximum length of the antenna pattern is smaller than an interval between the plurality of light sources, and
   wherein a width of the other side of the antenna pattern is smaller than a width of one side of the antenna pattern.

2. The lighting device of claim 1,
   wherein the first region is disposed between two adjacent light sources or on one side of one light source.

3. The lighting device of claim 1, comprising:
   a driving module disposed on one side of the substrate and having a light source driver for driving the light source and a near filed communication portion connected to the antenna pattern.

4. The lighting device of claim 3,
   wherein the driving module is attached to a lower surface of the substrate or connected to a connector of the substrate with a signal cable.

5. The lighting device of claim 1, comprising:
   an optical member on the resin layer and a light blocking portion disposed on each of the plurality of light sources,
   wherein the light blocking portion overlaps the antenna pattern in a vertical direction.

6. The lighting device of claim 1, comprising:
   a reflective layer on the resin layer,
   wherein light emitted from the plurality of light sources is extracted through one side of the resin layer,
   wherein the antenna pattern is disposed on an emission side of at least one of the plurality of light sources.

7. The lighting device of any-claim 1,
   wherein a thickness of the antenna pattern is thinner than a thickness of the reflective member,
   wherein the reflective member covers an entire surface of the antenna pattern.

8. A lighting device comprising:
   a substrate;
   a plurality of light sources arranged on the substrate;
   a resin layer sealing the plurality of light sources;
   a reflective member disposed between the resin layer and the substrate; and
   an antenna pattern disposed in a first region between the reflective member and the substrate,
   wherein the antenna pattern is formed as a partial pattern of a wiring layer disposed on the substrate, and
   wherein a thickness of the antenna pattern is the same as a thickness of the wiring layer,
   wherein the reflective member has a concave recess where the antenna pattern is disposed and
   wherein a maximum length of the antenna pattern is smaller than an interval between the plurality of light sources, and
   wherein a width of the other side of the antenna pattern is smaller than a width of one side of the antenna pattern.

9. The lighting device of claim 8,
   wherein the antenna pattern is disposed on an emission side of at least one of the plurality of light sources.

10. The lighting device of claim 8,
    wherein the other side of the antenna pattern is disposed adjacent to the emission side of at least one of the plurality of light sources.

11. The lighting device of claim 8, comprising:
    a driving module disposed on one side of the substrate and including a light source driver for driving the light source and a near filed communication portion connected to the antenna pattern,
    wherein the driving module is attached to a lower surface of the substrate or connected to a connector of the substrate with a signal cable.

12. The lighting device of claim 11, comprising:
    an optical member on the resin layer and a plurality of light blocking portions disposed on each of the plurality of light sources,
    wherein at least one of the plurality of light blocking portions overlaps the antenna pattern in a vertical direction.

13. The lighting device of claim 11, comprising:
    a reflective layer on the resin layer,
    wherein light emitted from the plurality of light sources is extracted through one side of the resin layer.

14. A vehicle lamp comprising:
    a lamp having at least one of a tail light, a turn signal light, a reversing light, a brake light, and a daytime running light,
    wherein the lamp has a lighting device according to claim 1.

15. The lighting device of claim 8,
    wherein the thickness of the antenna pattern is thinner than a thickness of the reflective member,
    wherein the reflective member covers an entire surface of the antenna pattern.

* * * * *